United States Patent [19]
Malone et al.

[11] 4,023,198
[45] May 10, 1977

[54] HIGH FREQUENCY, HIGH POWER SEMICONDUCTOR PACKAGE

[75] Inventors: Hugh R. Malone; Michael L. Matson, both of Phoenix; Bernhard A. Ziegner, Gilbert, all of Ariz.

[73] Assignee: Motorola, Inc., Chicago, Ill.

[22] Filed: May 17, 1976

[21] Appl. No.: 687,440

Related U.S. Application Data

[63] Continuation of Ser. No. 497,988, Aug. 16, 1974, abandoned.

[52] U.S. Cl. .................................. 357/81; 357/51; 357/71; 357/68; 357/74
[51] Int. Cl.² .................. H01L 27/02; H01L 23/02; H01L 23/48
[58] Field of Search .................. 357/51, 68, 71, 74, 357/81

[56] References Cited
UNITED STATES PATENTS

| | | | |
|---|---|---|---|
| 3,626,259 | 12/1971 | Garboushian et al. | 357/81 |
| 3,701,049 | 10/1972 | Van Iperen et al. | 357/74 |

Primary Examiner—Edward J. Wojciechowicz
Attorney, Agent, or Firm—M. David Shapiro

[57] ABSTRACT

A semiconductor packaging configuration is described in which a heat sink is bonded to a semiconductor chip or die and a conductor is bonded to the die and a metalized ceramic insulating body for achieving optimum heat transfer. Additionally, electrical matching and/or reduction of parasitic elements is achieved by a low pass matching filter comprising the capacitance of the chip or die, the capacitance of the metalized ceramic body and the inductance of the electrical conductor. This provides a significant improvement in power handling capabilities of a semiconductor chip or die operating at elevated temperatures and gigahertz frequencies. The electrical conductor geometry and its bonds provide a reduction of the thermal resistance of the package and also provides the inductance which forms part of the low pass matching filter.

12 Claims, 4 Drawing Figures

HIGH FREQUENCY, HIGH POWER SEMICONDUCTOR PACKAGE

This is a continuation of application Ser. No. 497,988 filed Aug. 16, 1974, now abandoned.

BACKGROUND OF THE INVENTION

There is a growing need for higher power microwave applications of diodes such as for solid state switches, oscillators, phase shifters, and amplifiers in radar and communication systems. To meet these needs the power handling capacity of the diode packages must be increased considerably.

Device temperature is the ultimate limiting factor in power handling capability. Device temperature has been lowered in a number of ways, but, in general, designs are pursued which provide lower thermal resistance in the device package and circuits are utilized which improve electrical matching, and provide lower series electrical resistance. These circuits have the desired effect of reducing heat energy input to the device while the designs which provide lower thermal resistance in the device package are used to remove energy after it is generated.

Presently available package configurations include the conventional ceramic pill package for the PIN diode. Above 500 MHz the parasitic electrical elements of this package usually limit the power handling capability of the diode by increasing the diode power losses. These parasitic elements also restrict the usable bandwidth. These two problems make parasitic reduction packages of great interest.

Parasitic reduction packages are available from many sources. Seals are typically made with Kovar leads through glass. Kovar is advantageous because its coefficient of thermal expansion closely matches that of glass and it forms an oxide that joins in a hermetic seal with the glass. Unfortunately, this circular cross section Kovar wire has a relatively high electrical resistance and the material is magnetic. The magnetic permeability of the material reduces the depth of penetration of the RF current and hence reduces the effective cross section through which the current flows. The resulting RF resistance for the Kovar wire is so high that it causes the leads to heat to the melting point when diodes in this type of package are tested as 200 watt switches at a frequency of approximately 3 GHz.

For gigahertz frequencies, a parasitic reduction package is needed that is useful for high power diode applications such as switching 600 watts or more.

Additionally, circuits integral to the device package must provide good impedance matching with the external circuits to provide efficient transfer of RF energy with minimized losses.

SUMMARY OF THE INVENTION

The present invention improves semiconductor power and frequency handling capability by utilization of an improved device package. Parasitic suppression and impedance matching is incorporated into the package by making use of the inherent capacitance of the semiconductor chip in conjunction with the inductance of a formed electrical conductor lead and capacitance of the dielectric inherent in a metalized insulating member, to form low pass matching filters situated in series with the chip. The invention provides an improved thermal sink for the generated heat energy by utilizing solder bonds of gold-tin and gold-germanium in the interfaces between chip, heat sink base means, insulating members and electrical conductor means. The gold ribbon electrical conductor also contributes significantly to the high thermal conductivity of the package.

Accordingly, it is an object of this invention to provide a semiconductor device package of much higher power capability than presently available for microwave applications such as diode switches, varactor multipliers, diode oscillators, diode phase shifters, and diode amplifiers.

It is another object of this invention to provide a semiconductor device package that can be used with microwave diodes to switch 600 watts (cw) or more of incident power at a frequency as high as 5 GHz.

It is still another object of this invention to provide a diode package that can be used in high temperature environments such as are encountered in military radar and communication equipment.

It is a further object of this invention to provide a semiconductor device package that is easily manufacturable and reliable in operation.

It is an additional object of this invention to provide a rugged device package suitable for use in extreme physical environments.

Various other objects and advantages will become evident from the following description of one embodiment of the invention; the novel features will be particularly pointed out hereinafter in connection with the appended claims.

DESCRIPTION OF THE PREFERRED EMBODIMENT

Figure 1:
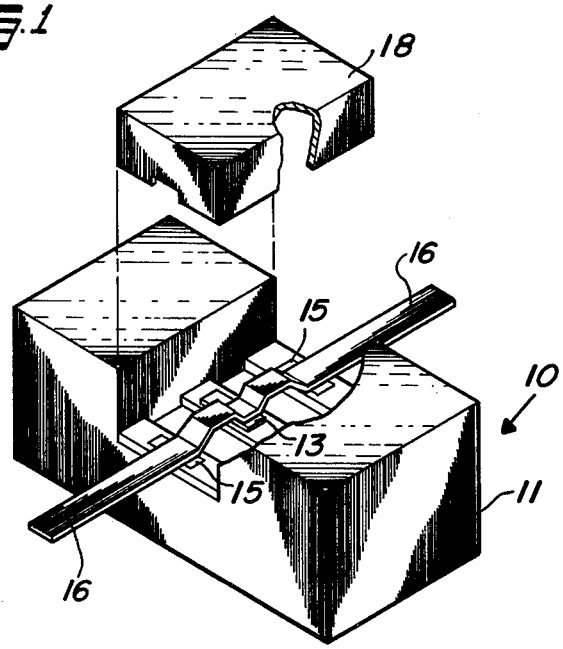
FIG. 1 is a pictorial view of the high power semiconductor diode package.
Figure 4:
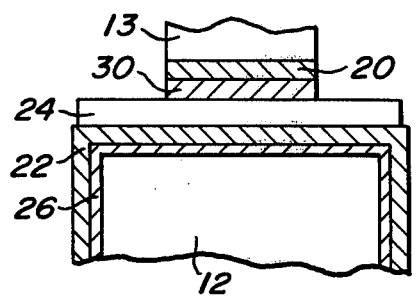
FIG. 4 is a detailed cross-sectional view of a typical semiconductor chip/heat sink base bond configuration.
Figure 2:
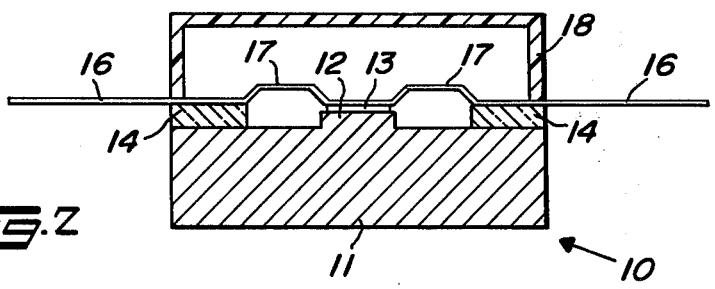
FIG. 2 is a cross sectional view of the high power semiconductor diode package of FIG. 1.

The present invention can be best understood by reference to FIGS. 1 and 2 wherein a preferred embodiment of the present invention is shown. A high power semiconductor diode package is generally designated by reference numeral 10. The package includes a metal heat sink base means 11 which is preferably made of oxygen free high conductivity copper and (see FIG. 4) preferably metalized successively with approximately 100 microinches of silver 26 and approximately 100 microinches of gold 22. Two insulating members 14 are preferably made of berylium oxide and preferably metalized 15 with successive layers of gold, nickel and finally, gold. The metallization pattern geometry 15 on the upper side of each of the insulating members 14 forms one electrode of capacitors 8 of FIG. 3, which is part of low pass filter matching means 34 used to tune out the capacitances 28 of diodes 13 for matching purposes. The insulating members 14 are attached to metal base member 11 preferably with a gold (88%)-germanium (12%) solder composition. A solder preform is clamped between each insulating member and the metal base member 11 and the assembly is heated in a die bonder to a temperature of approximately 360° C until the solder flows. The assembly 11, 14 is then removed from the die bonder and allowed to cool.

The metal heat sink base means 11 has a raised portion 12 to which two diode semiconductor chips 13 are bonded. The diode chips 13 are type MA 47401 made by Microwave Associates in the preferred embodiment of the invention. It may be appreciated that other diode types and other types of semiconductor chips may also be used in the invention. The MA 47401 diode chips 13 are preferably metalized with successive layers of nickel 20 and gold 30 on each of two electrode surfaces. The active surfaces are glass passivated. These chips 13 are bonded to raised portion 12 of heat sink 11 preferably with a gold (80%)-tin (20%) solder composition. A solder preform 24 is clamped between a chip 13 and the heat sink 11 and heated to approximately 290° C in a die bonder until the solder 24 flows. The heat source is then removed and the assembly is cooled with a nitrogen gas cooling jet. The process is repeated for the second chip 13.

Electrical conductor 16, preferably of gold ribbon, which may be of rectangular cross section approximately 0.050 inches by 0.005 inches, is formed with two raised portions 17. Raised portions 17 serve to provide for expansion and contraction of assembly 10 without excessive mechanical stress being applied to semiconductor chips 13 or insulating members 14 and they are used to adjust the inductance 19 (FIG. 3) value of electrical conductor 16 to provide the low pass matching filter 34 requirements of FIG. 3. Electrical conductor 16 is bonded to semiconductor chips 13 and insulating members 14 preferably using a gold (80%)-tin (20%) solder composition. The areas to be bonded on electrical conductor 16, insulating members 14 and chips 13 are alloyed with solder preforms preferably composed of gold and tin. The electrical conductor 16 is clamped in position as shown in FIGS. 1 and 2 and the clamped assembly 10 is heated to approximately 290° C until the solder reflows. The heat source is removed and the bonds are cooled with a nitrogen gas cooling jet. A plastic or ceramic cover 18 may then be bonded in place.

Figure 3:
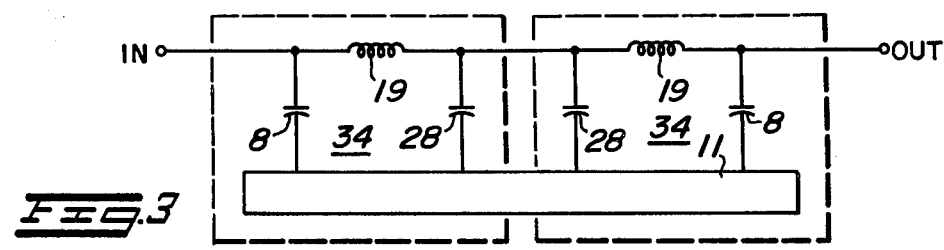
FIG. 3 is a schematic equivalent circuit of the low pass matching filters of the high power device package.

Referring to FIGS. 1, 2 and 3, the low pass matching filters 34 of FIG. 3 comprise the capacitance 8 of the dielectric of insulating members 14 disposed between electrical conductor 16 and metallization pattern 15 and metal base means 11; inductance 19 of raised portions 17 of electrical conductor; 16; and equivalent capacitance 28 of semiconductor diode chips 13.

The semiconductor diode device package as described herein is capable of switching more than 600 watts of RF power at frequencies in the C-band when operating at ambient temperatures as high as 50° C and producing a chip junction temperature of no more than 150° C.

The configuration as described allows 15 percent of the total heat energy loss to be conducted out of chip 13 via electrical conductor 16. This improved heat transfer is due to the use of a large cross section in electrical conductor 16 and the low thermal resistance of the bonds between electrical conductor 16, chip 13 and insulating members 14 and the thermal conduction characteristics of insulating members 14.

The remaining 85 percent heat loss is via the chip 13/heat sink 11 bond interface. The thermal resistance of this bond interface is approximately 0.5° C/watt or about one-fifth that of prior art bonds which may be only as low as 2.5° C/watt.

It is important to use gold metalization in bond interface areas. In cases where impure gold is used, degradation of thermal resistance of the bond interface can range up to as much as 50 percent.

The use of gold in electrical conductor 16 is significant in reducing heat energy. Because gold is a nonmagnetic material, there is relatively less RF "skin effect" resistance and the gold material has an RF conductivity of more than 140 times that of Kovar which is typically used in prior art devices.

This diode package (including the MA 47401 diodes described above) has been used in a single-pole-double-throw switch for 600 watts (cw) of incident power at 5 GHz (C-Band) which a VSWR of less than 1.15 to 1 and an insertion loss of less than 0.3 decibeles over a 20% bandwidth. The resulting temperature rise of the diode junctions was approximately 100° C in either switch position, i.e., forward or reverse bias of the diodes. The diode device is designed to operate reliably with a junction temperature of 200° C, so can handle 600 watts (cw) with a heat sink temperature of 100° C, and can handle considerably more power at lower room ambient temperatures that allow still lower heat sink temperatures.

This basic diode package can also be used for many other high power microwave applications such as varactor multiplier, diode oscillators, diode phase shifters, and diode amplifiers. Different diode chips can be used and minor modifications to the package components can be made to provide the desired electrical characteristics, as will be obvious to those skilled in this art. As an example, the package can be hermetically sealed with a ceramic cover 18, when the diode type used is not protected by glass passivation.

While diode semiconductor chips are used in the preferred embodiment of the invention, it will be apparent to one skilled in the art that transistors, thyristers and other semiconductor devices may also be used in this invention.

The foregoing description of the preferred embodiment of the invention is by way of example only and not intended to limit the scope of the appended claims. No attempt has been made to illustrate all possible embodiments of the invention, but rather only to illustrate its principles and the best manner presently known to practice it. Therefore, such other forms of the invention as may occur to one skilled in this art upon reading of the foregoing specification are also within the spirit and scope of the invention, and it is intended that this invention includes all modifications and equivalents which fall within the scope of the appended claims.

What is claimed is:

1. A device package for at least one semiconductor chip having a first side and an opposite side and having an inherent capacitance, comprising in combination:

a metal base member, said metal base member being fabricated of oxygen free high conductivity copper;

said at least one semiconductor chip being bonded on said first side to said metal base member and being in electrical contact therewith;

at least one insulator member having a first side and an opposite side, said first side of said at least one insulation member being bonded to said metal base member; and at least one low pass filter matching means for tuning out said semiconductor capacitance, said at least one low pass filter matching means comprising an electrical conductor being in electrical contact with and physically bonded to said opposite side of said at least one semiconductor chip and being in contact with and physically bonded to said opposite side of said at least one insulator member, said electrical conductor having at least one raised portion with respect to said opposite side of said at least one semiconductor chip and with respect to said opposite side of said at leat one insulator member said at least one raised portion being located between said at least one semiconductor chip and said at least one insulator member.

2. The combination of claim 1 wherein said at least one semiconductor chip is metallized on said first side and on said opposite side, said metallization comprising successive layers of nickel and gold.

3. The combination of claim 1 wherein said metal base member is metallized with successive layers of silver and gold.

4. The combination of claim 1 wherein said at least one insulator member is of a ceramic composition.

5. The combination of claim 4 wherein said ceramic composition is berylium oxide.

6. The combination of claim 1 wherein said insulator member is metallized on said physically bonded surfaces, said metallization comprising successive layers of gold, nickel and gold.

7. The combination of claim 1 wherein said at least one semiconductor chip is metallized on said first side and on said opposite side, said metallization comprising successive layers of nickel and gold; said metal base member is metallized with successive layers of silver and gold; said at least one insulator member is metallized on said physically bonded surfaces with successive layers of gold, nickel and gold; said at least one semiconductor chip is bonded to said metal base member with solder comprising gold and tin; said at least one insulator member is bonded to said metal base member with solder comprising gold and germanium; and said electrical conductor is bonded to said at least one semiconductor chip and to said at least one insulator member with solder comprising gold and tin.

8. The combination of claim 7 wherein said gold and germanium solder comprises approximately 88 percent gold and 12 percent germanium; and said gold and tin solder comprises approximately 80 percent gold and 20 percent tin.

9. A high power device package for at least one semiconductor chip, the chip having first and opposite sides, including a heat sink base having a plurality of mounting surfaces, and at least one insulator member having a plurality of mounting surfaces; comprising in combination:

a first metallization of successive layers of nickel and gold on the first and opposite sides of the at least one semiconductor chip, said successive layers of nickel and gold forming a first and a second electrode, respectively, for the at least one semiconductor chip;

a second metallization of successive layers of silver and gold on the heat sink base mounting surfaces;

a third metallization of successive layers of gold, nickel and gold on the mounting surfaces of the at least one insulator member; and a conductor made of gold ribbon, said conductor having a plurality of mounting surfaces, said conductor having at least one raised section for providing electrical inductance between said plurality of mounting surfaces, the at least one semiconductor chip being bonded by said first electrode to one of the plurality of mounting surfaces of said heat sink base with solder made of gold and tin, one mounting surface of the plurality of mounting surfaces of the insulating member being bonded to another of the plurality of mounting surfaces of the heat sink base with a solder made of gold and germanium, said gold conductor being bonded to said second electrode of the at least one semiconductor chip and to at least one other of the plurality of mounting surfaces of the at least one insulating member with solder made of gold and tin, said at least one formed section of said gold conductor being located between the at least one semiconductor chip and the at least one insulating member.

10. The combination according to claim 9 wherein said gold and tin solder comprises approximately 80 percent gold and 20 percent tin and wherein said gold and germanium solder comprises approximately 88 percent gold and 12 percent germanium.

11. A method of making a semiconductor device package including a heat sink base made of oxygen free high conductivity copper, at least one insulating member, at least one semiconductor chip having a first side and an opposite side and having an inherent capacitance, and a conductor made of gold; comprising the steps of:

metallizing the heat sink base with successive layers of silver and gold;

metallizing the at least one semiconductor chip on the first and opposite sides with successive layers of nickel and gold;

bonding the at least one semiconductor chip to the heat sink base with solder made of gold and tin;

metallizing opposite sides of the insulating member with successive layers of gold, nickel and gold;

bonding the insulating member to the heat sink base with solder made of gold and germanium;

forming the gold conductor to provide a predetermined inductance in at least one portion of the conductor;

bonding the gold conductor to the at least one insulating member and to the opposite side of the semiconductor chip with solder made of gold and tin, said inductance being positioned between the at least one semiconductor chip and the at least one insulating member.

12. The method according to claim 11 wherein said gold and tin solder comprises approximately 80 percent gold and 20 percent tin and wherein said gold and germanium solder comprises approximately 88 percent gold and 12 percent germanium.

* * * * *